US010470294B2

(12) United States Patent
Welsh et al.

(10) Patent No.: US 10,470,294 B2
(45) Date of Patent: Nov. 5, 2019

(54) REDUCTION OF PASSIVE COMPONENTS IN SYSTEM-IN-PACKAGE DEVICES

(71) Applicant: Octavo Systems LLC, Austin, TX (US)

(72) Inventors: Erik James Welsh, Bellaire, TX (US); Peter Linder, Sugar Land, TX (US)

(73) Assignee: OCTAVO SYSTEMS LLC, Austin, TX (US)

(*) Notice: Subject to any disclaimer, the term of this patent is extended or adjusted under 35 U.S.C. 154(b) by 0 days.

(21) Appl. No.: 15/968,171

(22) Filed: May 1, 2018

(65) Prior Publication Data

US 2018/0317316 A1    Nov. 1, 2018

Related U.S. Application Data

(60) Provisional application No. 62/492,778, filed on May 1, 2017.

(51) Int. Cl.
| | | |
|---|---|---|
| H05K 1/11 | (2006.01) | |
| H05K 1/14 | (2006.01) | |
| H05K 1/02 | (2006.01) | |
| G06F 17/50 | (2006.01) | |
| H01L 25/16 | (2006.01) | |
| H05K 1/18 | (2006.01) | |

(52) U.S. Cl.
CPC ....... *H05K 1/0231* (2013.01); *G06F 17/5063* (2013.01); *G06F 17/5072* (2013.01); *H01L 25/16* (2013.01); *H05K 1/181* (2013.01); *H05K 2201/10015* (2013.01); *H05K 2201/10522* (2013.01)

(58) Field of Classification Search
CPC ... G06F 17/5072; H01L 25/16; H05K 1/0231; H05K 1/181; H05K 2201/10015; H05K 2201/10522
See application file for complete search history.

(56) References Cited

U.S. PATENT DOCUMENTS

| | | | |
|---|---|---|---|
| 4,667,403 A | 5/1987 | Edinger | |
| 5,303,122 A * | 4/1994 | Adams, Jr. | ........... H05K 1/0295 174/261 |
| 5,396,403 A | 3/1995 | Patel | |
| 5,683,788 A | 11/1997 | Dugan | |
| 5,696,029 A | 12/1997 | Alvarez et al. | |
| 6,133,626 A | 10/2000 | Hawke | |
| 6,268,238 B1 | 7/2001 | Davidson | |
| 7,060,535 B1 | 6/2006 | Sirinorakul et al. | |

(Continued)

FOREIGN PATENT DOCUMENTS

| | | |
|---|---|---|
| EP | 1926138 A1 | 5/2008 |
| WO | 9852226 A1 | 11/1998 |
| WO | 2016025693 A1 | 2/2016 |

OTHER PUBLICATIONS

Office Action issued for U.S. Appl. No. 15/968,184 dated Nov. 15, 2018, 25 pages.

(Continued)

*Primary Examiner* — Yuriy Semenenko
(74) *Attorney, Agent, or Firm* — Rothwell, Figg, Ernst & Manbeck P.C.

(57) ABSTRACT

Methods and systems for reducing the number of, and values of, passive components, such as capacitors, in System-in-Package devices below vendor recommendations for an active component are provided.

20 Claims, 8 Drawing Sheets

(56) References Cited

U.S. PATENT DOCUMENTS

| | | | |
|---|---|---|---|
| 8,065,576 | B2 | 11/2011 | Miner et al. |
| 9,490,188 | B2 | 11/2016 | Arvelo et al. |
| 2002/0017708 | A1 | 2/2002 | Takagi et al. |
| 2002/0052054 | A1 | 5/2002 | Akram |
| 2002/0170901 | A1 | 11/2002 | Lau |
| 2003/0110427 | A1 | 6/2003 | Rajsuman et al. |
| 2004/0229400 | A1 | 11/2004 | Chua |
| 2008/0029868 | A1 | 2/2008 | Lee |
| 2008/0288908 | A1 | 11/2008 | Hart et al. |
| 2008/0290486 | A1 | 11/2008 | Chen et al. |
| 2009/0278245 | A1 | 11/2009 | Bonifield et al. |
| 2010/0052135 | A1 | 3/2010 | Shim et al. |
| 2010/0134133 | A1 | 6/2010 | Pagani |
| 2011/0233753 | A1 | 9/2011 | Camacho et al. |
| 2012/0241984 | A9 | 9/2012 | Pendse |
| 2013/0214386 | A1 | 8/2013 | Xie |
| 2015/0130040 | A1 | 5/2015 | Defretin |
| 2016/0216731 | A1* | 7/2016 | Goh .................. G06F 1/163 |
| 2017/0077072 | A1* | 3/2017 | Yap .................. H01L 25/105 |
| 2017/0213885 | A1* | 7/2017 | Wu .................... H01L 28/91 |
| 2017/0302224 | A1* | 10/2017 | Frenette .............. H05K 1/181 |

OTHER PUBLICATIONS

International Search Report and Written Opinion issued in Application No. PCT/US2015/045022, dated Nov. 4, 2015, 14 pages.
International Search Report and Written Opinion issued in Application No. PCT/US16/50157, dated Jan. 17, 2017, 24 pages.
International Search Report and Written Opinion issued in Application No. PCT/US17/015728, dated Jun. 6, 2017, 16 pages.
International Search Report and Written Opinion issued in Application No. PCT/US17/49611, dated Dec. 27, 2017, 17 pages.
International Search Report and Written Opinion issued in Application No. PCT/US17/052014, dated Dec. 4, 2017, 15 pages.
International Search Report and Written Opinion issued in Application No. PCT/US18/16171, dated Apr. 25, 2018, 12 pages.
C.R. Schlottmann, "Analog Signal Processing on a Reconfigurable Platform", Master's Thesis, School of Electrical and Computer Engineering, Georgia Institute of Technology, Aug. 2009, 72 pages.
J. McEleney, et al., "Multisite Test Strategy for SIP Mobile Technologies", Jul. 2006, 6 pages.
R. Normann, "First High-Temperature Electronics Products Survey 2005", Sandia Report, Apr. 2006, 44 pages.
S. Bernard, et al., "Testing System-In Package Wirelessly", IEEE, DTIS'06: Design and Test of Integrated Systems in Nanoscale Technology, Sep. 2006, Tunis (Tunisia), pp. 222-226, http://hal-lirmm.ccsd.cnrs.fr/lirmm-00094916, Sep. 15, 2006.
D. Appello, et al., "System-in-Package Testing: Problems and Solutions", IEEE, May-Jun. 2006, 4 pages.
Z. Noun, et al., "Wireless Approach for SIP and SOC Testing", Micro and nanotechnologies/Microelectronics, Université Montpellier II—Sciences et Techniques du Languedoc, 2010, English, https://tel.archives-ouvertes.fr/tel-00512832, Aug. 31, 2010, 66 pages.
P. O'Neill, "Choosing the Right Strategy for SIP Testing", EE Times, Connecting the Global Electronics Community, May 10, 2004, 2 pages.
M., Quirk, et al., "Semiconductor Manufacturing Technology", IC Fabrication Process Overview, Chapter 9, Oct. 2001, 41 pages.
J. Watson, et al., "High-Temperature Electronics Pose Design and Reliability Challenges", Analog Dialogue 46-04, Apr. 2012, 7 pages.
S. Benjaafar, et al., "Batch Sizing Models for Flexible Manufacturing Cells", Submitted to International Journal of Production Research, Department of Mechanical Engineering, University of Minnesota, 1995, 43 pages.
C. T. Sorenson, "Semiconductor Manufacturing Technology: Semiconductor Manufacturing Processes", NSF/SRC Engineering Research Center for Environmentally Benign Semiconductor Manufacturing, Arizona Board of Regents for the University of Arizona, 1999, 34 pages.
"Downhole Solutions", Motion Control Solutions Tailored to Your Critical Downhole Applications, What Moves Your World, MOOG, May 2013, 8 pages.
A. Weintraub, "Is Mass Customization the Future of Retail?", https://www.entrepreneur.com/article/229869, Nov. 14, 2013, 5 pages.
Hashimoto et al., "A System-in-Package (SiP) With Mounted Input Capacitors for Reduced Parasitic Inductances in a Voltage Regulator," 2010, IEEE, 25(3), pp. 731-740.
Office Action issued for U.S. Appl. No. 15/503,932 dated Jan. 5, 2018, 20 pages.
Final Office Action issued for U.S. Appl. No. 15/503,932 dated Aug. 2, 2018, 9 pages.

* cited by examiner

PRIOR ART

| Component | Recommended | Example A | Example B |
|---|---|---|---|
| 10uF | 30 | 17 | 0 |
| 2.2uF | 4 | 6 | 23 |
| 0.1uF | 17 | 11 | 11 |
| 0.047uF | 22 | 9 | 9 |
| 0.01uF | 45 | 27 | 27 |
| Number | 118 | 70 | 70 |
| Cost ($) | 0.73 | 0.43 | 0.26 |
| Area (mm) | 97.8 | 59.1 | 44.6 |
| Delta $/Area | 0/0 | 0.30/38.7 | 0.47/53.2 |

FIG. 7

| Voltage | $C_L$ | $C_S$ |
|---|---|---|
| VDD_CORE | 1 | 8 |
| VDD_MPU | 1 | 5 |
| VDDA_ADC |  | 2 |
| VDDA_1P8V |  | 1 |
| VDDA_3P3V |  | 1 |
| VDDS | 1 | 4 |
| VDDS_DDR | 3 | 18 |
| VDDS_OSC |  | 1 |
| VDDS_SRAM_CORE_BG | 1 | 1 |
| VDDS_SRAM_MPU_BB | 1 | 1 |
| VDDS_PLL_MPU |  | 1 |
| VDDS_RTC |  | 1 |
| VDDSHV1 | 1 | 2 |
| VDDSHV2 | 1 | 2 |
| VDDSHV3 | 1 | 2 |
| VDDSHV4 | 1 | 2 |
| VDDSHV5 | 1 | 2 |
| VDDSHV6 | 1 | 6 |

PRIOR ART

REDUCTION OF PASSIVE COMPONENTS IN SYSTEM-IN-PACKAGE DEVICES

CROSS REFERENCE TO RELATED APPLICATION

This application claims the benefit of U.S. Patent Application No. 62/492,778 filed on May 1, 2017, the disclosure of which is incorporated herein in its entirety by reference.

TECHNICAL FIELD

Disclosed are embodiments relating generally to the reduction in the size and/or number of passive components in a System-in-Package ("SiP") device.

BACKGROUND

Integrated circuit devices are designed to be robust and very reliable when used within a specified set of requirements and conditions. For instance, one requirement is the voltage and any allowable range over which a device in a system will receive its power. As such, recommendations for a particular component, such as an integrated circuit, may be provided by a vendor. However, such recommendations may be inappropriate or otherwise incorrect for a system design utilizing SiP technology. That is, use of recommended numbers and values may fail to utilize the space and cost savings associated with SiP design implementation.

Accordingly, there remains a need for methods and systems that can reduce the number of and/or values of passive components, such as capacitors, in SiP-type systems and devices below vendor recommendations for a given active component.

SUMMARY

There are often several aspects to be considered when specifying the voltages to be used for the devices in a system. A first consideration may be the specific value of voltage to be supplied. For example, an input voltage may have a nominal specification of 1.8 volts, but will then have a minimum and maximum requirement of 1.7 volts and 1.9 volts respectively. However, there may be other concerns about the quality of the voltage over its specified range. Two typical measures of the quality of the voltage supply are the allowable voltage sag and the high frequency noise that may be present on the voltage supply lines. Generally, the technique used to manage the sag and noise on the voltage rails is to use bypass capacitors on the voltage supply lines. Larger value capacitors, typically in the 1 to 20 uF range, are used to minimize any voltage sag due to current surges in the system. Smaller capacitors, typically in the range of 100 pF to 0.1 uF, are used to eliminate high frequency noise on the voltage supply lines resulting from sources like clocks or communications signals.

There is another aspect that may be taken into account when specifying how to do a system design—the number and values of the bypass capacitors. One of the underlying assumptions can relate to how far the components are apart from each other. In a typical system design, the electrical distance between the power source and the component receiving the power is many centimeters. Also, with the power requirement for many high performance devices, such as microprocessors, there are typically many pins dedicated to the voltage supply. The result is a recommendation from each of the vendors who manufactures a component to include the size or value and number of decoupling or bypass capacitors to be included in a design using their component; these recommendations are meant to ensure that the reliability and operation of their components does not suffer due to a voltage sag or excessive noise on a voltage supply. However, such recommendations may be inappropriate for SiP implementation.

One significant advantage of a SiP implementation is the reduction in distance between the power source, such as for example, but not limited to, a power management integrated circuit (PMIC), and the components in the SiP which are being powered. In the case of the SiP, the distance between the PMIC and the various components are typically measured in millimeters rather than centimeters. In addition, many, if not all, of the active components may be attached to the SiP's substrate in die form rather than as a packaged device. This may also reduce the electrical distance between the power source and the component by eliminating the trace length inside the device package. A SiP implementation advantage, therefore, is that the number of bypass or decoupling capacitors may be fewer in number and their capacitive values may be smaller than those recommended by a product data sheet for a particular active component, when used in a SiP. By reducing the number of bypass capacitors, not only does the bill of material (BoM) cost go down, but the surface area of the SiP's substrate may either be reduced or allow for more components to be added to it.

According to some embodiments, a method for designing a System-in-Package (SiP) comprises determining the number of and capacitance values for a first type of capacitor; determining the number of and capacitance values for a second type of capacitor; and arranging a layout for the SiP using the first and second types of capacitors and one or more active components, where the determined number of the first type of capacitors is less than vendor recommended numbers of capacitors of the first type for the respective one or more active component.

In some embodiments, the determined number of the second type of capacitors is less than a vendor recommended number of capacitors of the second type for the one or more active components. In some embodiments, the capacitance values for the first type of capacitors is less than vendor recommended capacitance values of the first type for the one or more active components, and the capacitance values for the second type of capacitors is less than vendor recommended capacitance values of the second type for the one or more active components. In some embodiments, at least one of determining the number of and capacitance values for a first type of capacitors and determining the number of and capacitance values for a second type of capacitors is based at least in part on a reduction in component interconnection path lengths in the SiP. The method may also comprise adding an additional active component without increasing an area of the SiP substrate.

According to some embodiments, a System-in-Package (SiP) is provided. It may comprise, for instance, a SiP substrate; at least one electronic circuit mounted on the SiP substrate, wherein the electronic circuit has a vendor recommended quantity for a first type of capacitor for correct operation of the at least one electronic circuit; and a first plurality of capacitors of the first type connected to the electronic circuit, wherein the number of the first plurality of the first type of capacitors is less than the vendor recommended quantity.

According to some embodiments, the SiP may further comprise a second plurality of capacitors of a second type of capacitor connected to the at least one electronic circuit, wherein the at least one electronic circuit has a second vendor recommended quantity for the second type of capacitor for correct operation of the at least one electronic circuit, and wherein the first number of the second plurality of the second type of capacitors is less than the vendor recommended quantity. In some embodiments, the first type of capacitors are large-valued core voltage decoupling capacitors and the second type of capacitors are small-valued noise decoupling capacitors. In some embodiments, the first plurality of the first type of capacitors is connected to a power rail from an electronic circuit supplying power and located adjacent the at least one electronic circuit, and the second plurality of the second type of capacitors is connected to said power rail and located adjacent the at least one electronic circuit.

In some embodiments, the reduced quantity of first and second pluralities of capacitors is functionally related to the relative distance between a power circuit, such as a Power Management Integrated Circuit (PMIC) and the electronic circuit.

According to some embodiments, a System-in-Package (SiP) is provided, which comprises a SiP substrate; at least one electronic circuit mounted on the SiP substrate, wherein the electronic circuit has vendor recommended capacitive values for a first type of capacitor for correct operation of the at least one electronic circuit; and a first plurality of capacitors of the first type connected to the electronic circuit, wherein the capacitive value of at least one of the first plurality of the first type of capacitors is less than the vendor recommended value. The SiP may also comprise a second plurality of capacitors of a second type of capacitor connected to the at least one electronic circuit, wherein the at least one electronic circuit has a second vendor recommended value for the second type of capacitor for correct operation of the at least one electronic circuit, and wherein a value of at least one of the second plurality of the second type of capacitors is different than the vendor recommended value. For instance, in some embodiments, it is less. In certain aspects, the quantity of the first or second type of capacitor may also change. In some embodiments, the reduced values of and/or quantities of the first and second pluralities of capacitors is functionally related to the relative distance between a power circuit and the electronic circuit.

These and other features of the present disclosure will become apparent to those skilled in the art from the following detailed description, taken together with the accompanying drawings.

BRIEF DESCRIPTION OF THE DRAWINGS

The accompanying drawings, which are incorporated herein and form part of the specification, illustrate various embodiments.

FIG. 5 is a table depicting reductions according to some embodiments.

FIG. 7 is a table depicting vendor requirements.

Together with the description, the drawings further serve to explain the principles of the disclosure and to enable a person skilled in the pertinent art to make and use the embodiments disclosed herein. In the drawings, like reference numbers indicate identical or similar functionally.

DETAILED DESCRIPTION

Figure 1:
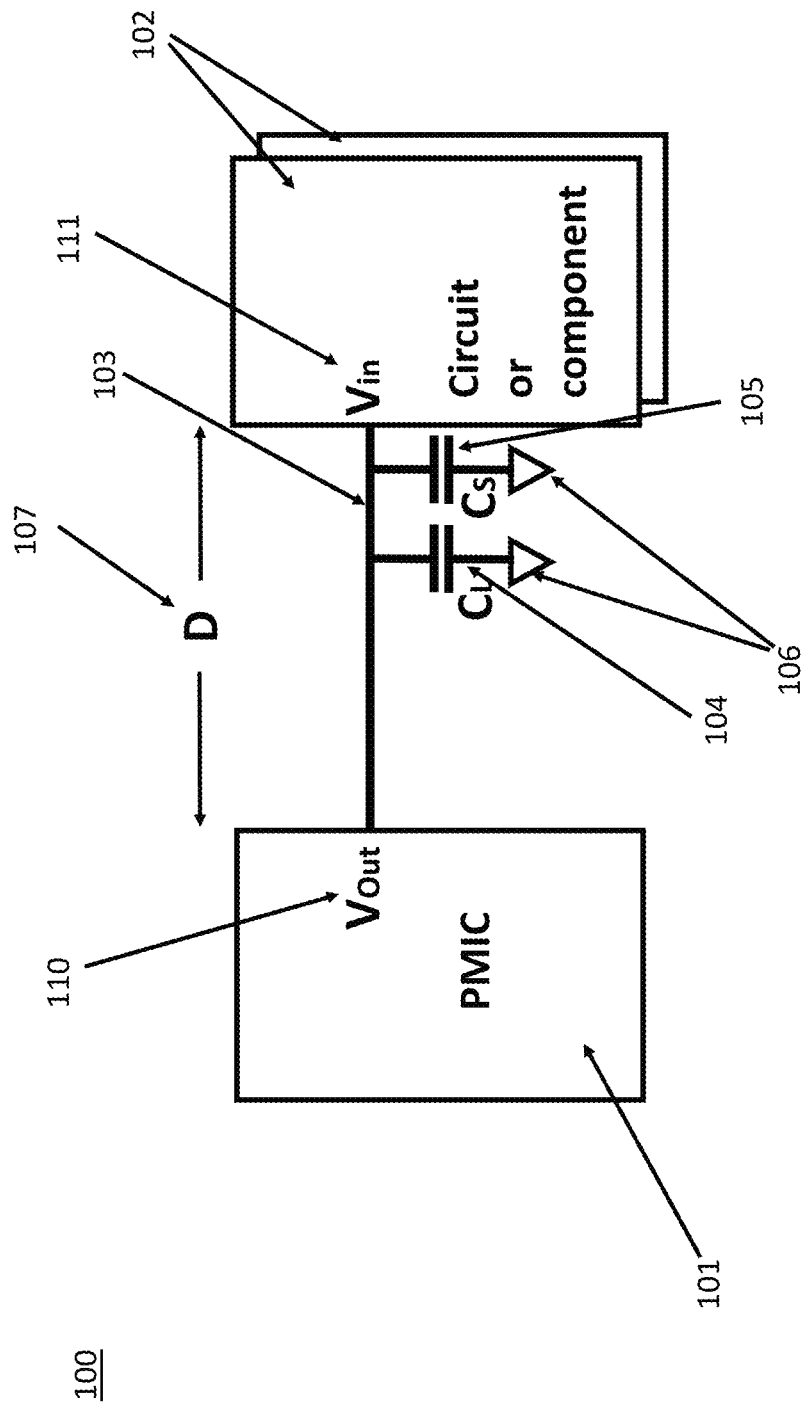
FIG. 1 depicts a schematic of a system with active and passive components with power management according to some embodiments.

FIG. 1 depicts a schematic of a plurality of circuits or other components 102 in a system that are electrically connected to a power circuit 101, such as a Power Management Integrated Circuit (PMIC). In this example, the power circuit 101 and components 102 are connected with two bypass capacitors 104 and 105. For instance, they may be connected to the main voltage supply to the components using power rail 103. Although depicted as a single line, for ease of depiction and discussion purposes, according to some embodiments, there may be several different lines, with each line supplying a different voltage to the components. In some embodiments, both of the capacitors 104, 105 are also electrically tied to ground 106. Again, for ease of depiction and discussion purposes, although only two capacitors are depicted, there may be several different capacitors with two or more for each line supplying a voltage to the components. The following discussions for the two depicted capacitors could apply to any such capacitors so used on a voltage supply line.

According to some embodiments, one of the two bypass capacitors (CL) 104 is a large value capacitor. In this example, its purpose is to assure that the circuits 102 continue to have adequate power to perform properly. The appropriate size of the large valued capacitor may depend on certain factors, such as the (electrical and physical) distance between the PMIC 101 and each of the specific components 102, along with the current demands of the various components. For instance, the further apart the two are, the higher the capacitive value the capacitor 104 likely needs to be. Also, the larger the potential current demand by each of the components 102 being powered by the power rail 103, the larger the capacitor value likely needs to be and also potentially the number of capacitors needed may increase. In certain aspects and implementations, the reason for the large capacitor may be to make sure that there is no voltage sag at the component 102 due to the current flowing through the trace (wire) 103 connected between the PMIC 101 and component 102. The longer distance (D) 107 of the interconnection or trace 103 the larger the voltage sag may be during periods of high current demands. The capacitor 104 can act as a local storage element to provide the necessary current and voltage to the component during a high current demand.

In a Printed Circuit Board (PCB) design the interconnection or trace 103 length 107 is typically much longer than it is on a substrate of a System-in-Package implementation of the same design. Whereas in the PCB design this length may be measured in centimeters, in an equivalent SiP design this length may often be measured in millimeters according to some embodiments. That is, according to some embodiments, active components in a SiP may have distances from the PMIC 101 and other power devices to the active components, such as a microprocessor (uP/uC), memories, and interface components, that are measured in millimeters rather than centimeters. Similarly, the requirement for the size of and number of bypass capacitors can be different from those recommended in the data sheets for the individual components, such as, for example, a PMIC, a microprocessor/microcomputer, and memories (e.g., DDR).

Vendor data sheets for various general purpose components are typically written for a PCB type design case, rather than a SiP design case, and thus may be overly conservative for a SiP case. For instance, the reduction in length of a power trace, or power rail, 103 in a SiP design allows the capacitive value and number of a manufacturer suggested large bypass capacitors (CL) to be significantly reduced to a smaller capacitive value and/or number, which saves in both cost and size for a SiP substrate implementation according to some embodiments. Further, depending upon the fabrication process (e.g., 65 nanometers) the physical size of a capacitor for a selected capacitive value may be fabricated in a variety of physical sizes that depend upon the voltage and current to which that capacitor will be subjected. In many cases, there are multiple numbers of these capacitors included to make sure the power distribution to a component is adequately protected against the voltage sag due to any long interconnection distances. Once again, and according to some embodiments, the shorter distance of a power trace, or power rail, 103 allows for not only smaller capacitor values but also a reduction in the number of capacitors needed to provide the same voltage sag protection.

According to some embodiments, the other capacitor (CS) 105 maybe be a much smaller capacitor in capacitive value that is employed, for instance, to reduce any high frequency noise found on a power trace 103. With the shorter length of the power trace 103 found in a SiP according to embodiments, there is also less need for these smaller bypass capacitors. As these capacitors 105 are generally smaller in both size and value than the larger value capacitor 104, the cost and size savings per eliminated device for a smaller device value has less impact than does the larger capacitor 104. But generally there are many more of the smaller capacitors 105 used in a non-SiP design, so the ultimate cost and size reduction in a SiP design may be significant. Cost reductions may include, for instance, cost reductions regarding the substrate, capacitors, and assembly costs, among others.

Figure 2:
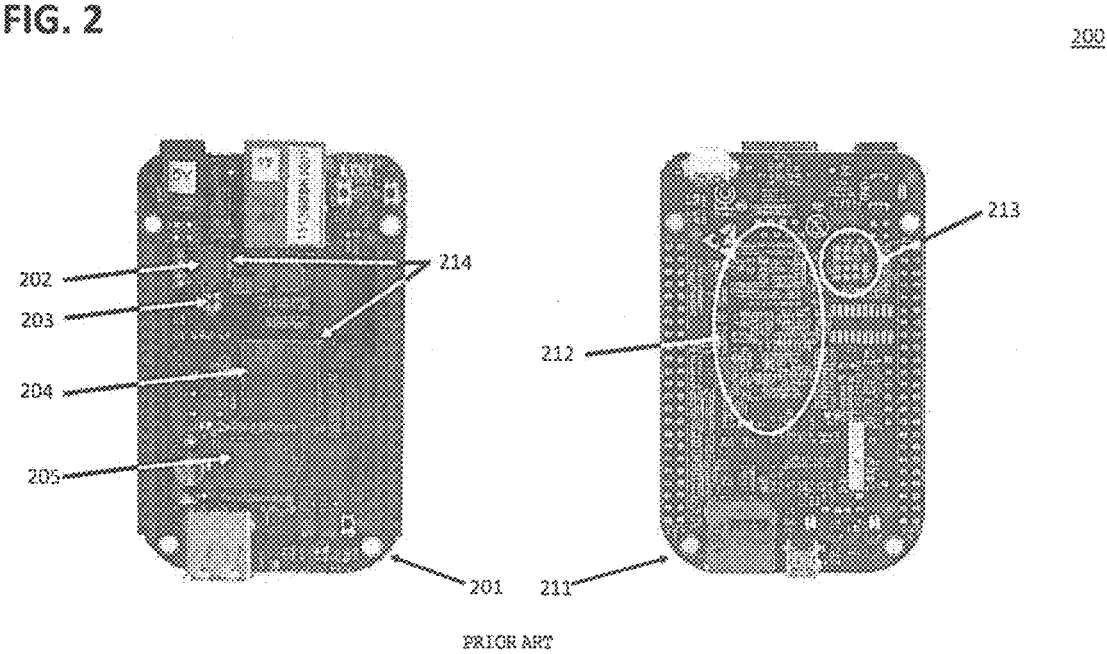
FIG. 2 depicts a PCB-based system.

FIG. 2 depicts the top 201 and bottom 211, respectively, of a Printed Circuit Board (PCB) implementation of a system. In this example, the size of the PCB is 5.46 cm by 8.64 cm, as compared to the 2.7 cm size of each side of the SiPs 301 and 311 shown in FIGS. 3A and 3B, and the 2.1 cm size of each side of the SiP, for the same system of FIGS. 3A and 3B, 411 shown in FIG. 4B. FIGS. 3A and 3B depict a SiP design representative of the system depicted in FIG. 2. For example, they represent the potential components contained in the areas outlined 214, which may include components 202, 203, 204, 205 plus the passive components encircled in 212 and 213 according to some embodiments.

Figure 3:
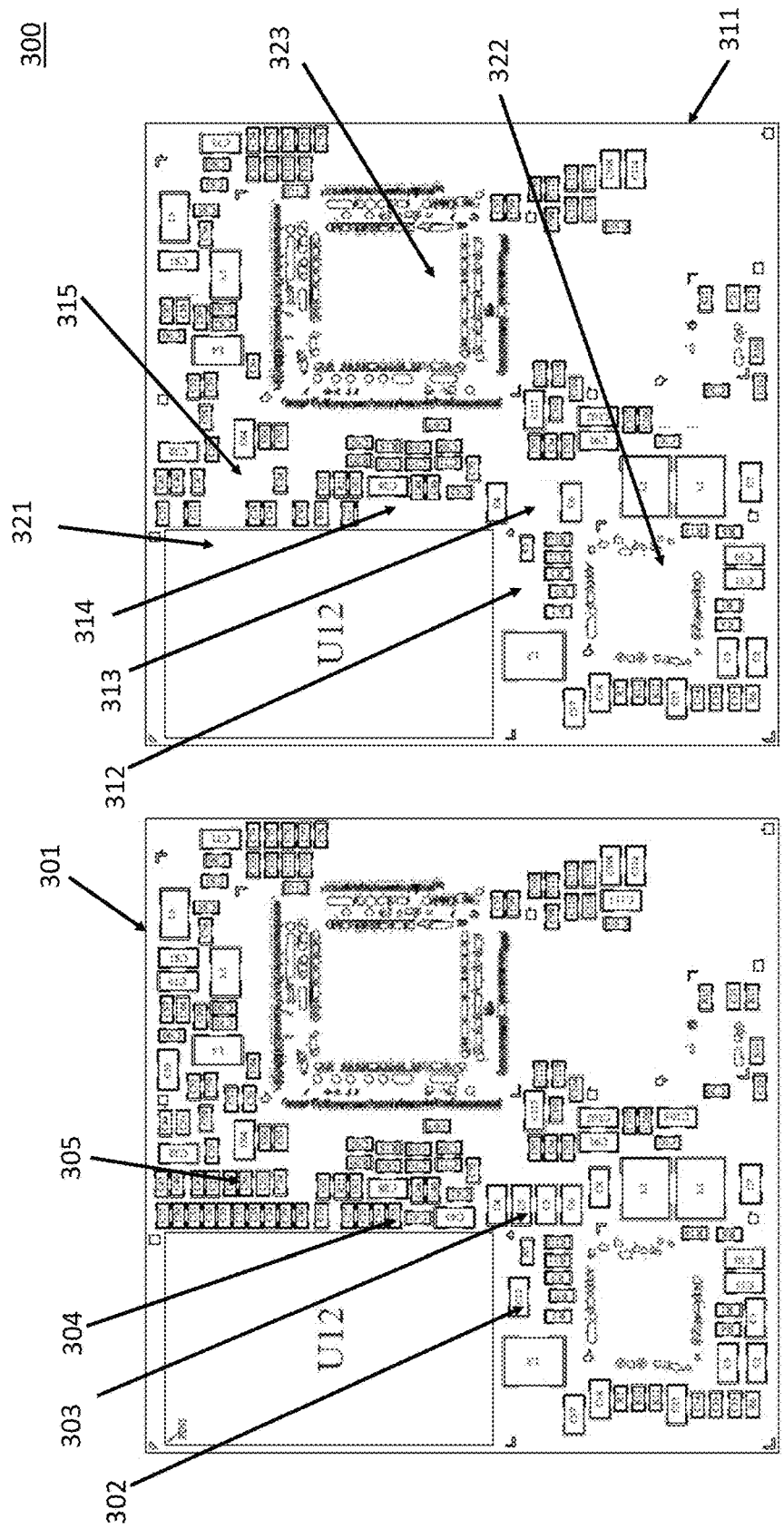
FIGS. 3A and 3B depict a SiP system according to some embodiments.

Referring now to FIG. 2, it may be seen that the power management device 202 is about 3 cm from the microprocessor 204 and about 5 cm from the memory 205. Whereas in FIG. 4A, in the SiP design 401 the distance from the power management device 404 to the microprocessor 402 is about 1 cm and the distance to the memory device 403 is about 0.5 cm. Further it may be seen in FIG. 4B that in the SiP design 411, the distance from the power management device 414 to the microprocessor 412 is about 0.5 cm and to the memory device 413 is about 1 cm. The SiP based designs of FIGS. 3 and 4 are shorter in distances for interconnection paths than that of the PCB design of FIG. 2.

FIG. 3A depicts a SiP design 301 that was initially designed based on the vendor recommendations for the values and numbers of bypass capacitors for the components used in a packaged form, or as bare die, in this SiP. In FIG. 3A, for the populated substrate there are large value capacitors 302 and 303 and small value capacitors 304 and 305. In the second depiction of the same SiP design 311 in FIG. 3B according to some embodiments, it may be seen that many of the capacitors may be removed, for instance, both the large value ones 312 and 313 and the number of smaller value ones 314 and 315. In FIGS. 3A and 3B, the number of bypass capacitors may also be reduced from 118 to 70, while the circuit 311 with the reduced value sizes and reduced number of capacitors will perform as well as the SiP design 301 that was designed using the size and number of manufacturer recommended bypass capacitors. According to some embodiments, the reduction in values and numbers of bypass capacitors used in 311 is possible as a result of the shorter interconnection distance between the various components used in the SiP.

Figure 4:
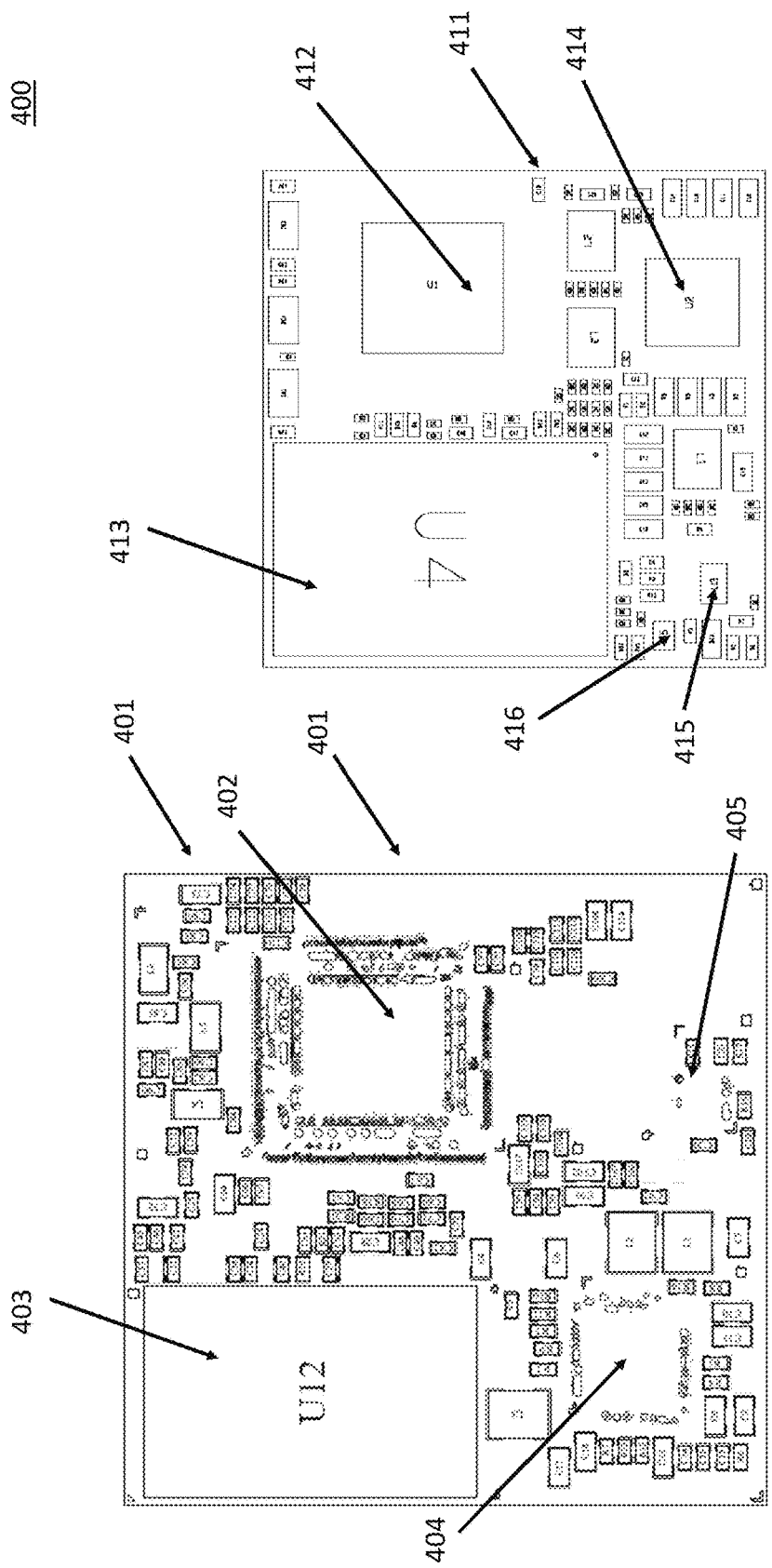
FIGS. 4A and 4B depict a SiP system according to some embodiments.

FIGS. 4A and 4B depict a further example of reducing the value size and number of bypass capacitors according to some embodiments. The design depicted in FIG. 4A could be the same as the design depicted in FIG. 3B, and as such, the layout in FIG. 4A may already have a reduction in the capacitive value and number of large value capacitors and reduction in numbers of smaller value capacitors, a described earlier. According to some embodiments, the layout of the SiP example 401 depicted in FIG. 4A with a microprocessor 402, memory 403, power management device (PMIC) 404 and Low Drop Out power supply (LDO) 405 has a further cost and size reduction by modifying the layout of the substrate in FIG. 4A to be a re-layout taking advantage of the reduced numbers and values and corresponding physical sizes of bypass capacitors to become the one depicted in FIG. 4B, 411. In certain aspects, 411 is not only smaller with the same circuits 412, 413, 414, 415, as in FIG. 4A, but with an added component 416. In this example, the overall size reduction was from a substrate size of 27 mm on a side for FIG. 4A to 21 mm on a side for FIG. 4B, making a total reduction in area from 729 mm$^2$ to 441 mm$^2$. Again, the performance of SiP 411 of FIG. 4B may be the same as that of the SiP 301 of FIG. 3A and SiP 401 of FIG. 4A according to embodiments.

FIG. 5 shows a chart 500 summarizing an original SiP design based on the vendor recommendation of decoupling (or "bypass") capacitors 502 like that of FIG. 3A, and two variations of that same SiP design using a reduced set of bypass capacitors, Examples A and B, which may be depicted by FIGS. 3B and 4B, respectively. The first of the two variations may be to remove a number of unneeded capacitors 503, shown as Example A, and then reduce the capacitive value of the large capacitors, in addition to a reduction in the numbers of the capacitors 504, shown as Example B.

In this example, a set of capacitor values 505 is listed in the first column, each Component, 501 was used based on the circuit or component vendors' recommendations. The numbers and capacitive values are listed in the data sheet for each component used in the SiP design. In this example the total number of capacitors shown in the "number" row 506 was reduced from 118 to 70. It can be further shown by looking at the two examples (A and B) 503 and 504, respectively, that in Example B not only were the number of capacitors reduced, but the values of the large capacitors were reduced from 10 uF to 2.2 uF. This capacitive value reduction allowed for the large capacitors to not only be fewer in number, but smaller in both physical size and cost.

According to some embodiments, the various physical sizes of the capacitors (e.g., 0805, 0603, 0402, etc.) are chosen based on the requirements for the device. An 0603 device, for example, has the physical size of 60 mils (1.5 mm) by 30 mils (0.75 mm) by 30 mils (0.75 mm) in the X, Y and Z dimensions. Such things as capacitive value, voltage, tolerance and cost will often dictate the physical size of the passive device. In the examples, a device size for a 10 uF cap to have a reasonable operating voltage of 10 volts and lowest cost was a 0603 package. But moving to a 2.2 uF capacitor, the best size was a 0402 for a 10 volt operating range and low cost. For capacitor values greater than 10 uF, one may need an 0805 package, which could create another problem of it being too large in the "Z" dimension to fit into a SiP package in certain aspects.

As a result of the bypass capacitor reductions in these examples, the cost shown in the "cost" row 507 was reduced from $0.73 to $0.43 in Example A and to $0.26 for Example B for all of the capacitors of each design in the chart. At the same time the areas shown in the "area" row 508 for all the capacitors of each design was reduced from 97.8 mm$^2$ to 59.1 mm$^2$ in Example A and to 44.6 mm$^2$ in Example B. This provided a total cost savings shown in the Delta $/Area row 509 of $0.30 510 and $0.47 512 in Examples A and B respectively. It also provided a total area savings of 38.7 mm$^2$ 511 and 53.2 mm$^2$ 513 from Examples A and B, respectively.

According to some embodiments, and with further reference to FIGS. 3-5, reducing the impact of a large capacitor's effect on a SiP design may be done in several ways. For instance, benefits may be achieved by actually inserting a lower capacitive value to replace the large one; doing this may allow a smaller physically sized component to be used (e.g., use a 0402 rather than a 0603 or 0805). Additionally, in many cases the capacitive value of the large capacitor may be implemented by using multiple smaller ones which add up to the larger value; this could be done for various reasons such as voltage requirements and size constraints. So reducing the capacitive value may be done by reducing the number of large capacitive value capacitors. In the example illustrated with respect to FIG. 5, the reduction in the number of large valued capacitors was depicted by reducing the number of 10 uF capacitors from 30 to 17 10 uF capacitors (plus two 2.2 uF caps which replaced two of the 10 uF caps) from "Recommended" column 502 to Example A column 503.

Further referring to FIG. 5, and referring to Example A column 503 and Example B column 504, it may be seen that the number of 10 uF capacitors is further reduced to zero and the capacitive value for 10 uF capacitors is decreased to 2.2 uF capacitors according to some embodiments. By going to 2.2 uF capacitors the physical size of the capacitors went from 0603 s to 0402 s in this example. Accordingly, methods of reducing the numbers of and capacitive value of the large value capacitors are provided.

Continuing to refer to FIG. 5, the collective smaller capacitive value capacitors (e.g. 0.1, 0.047 and 0.01 uF capacitors) in column 501 show reductions in numbers of capacitors from Recommended column 502 to Example A column 503, but do not have further reductions in numbers from Example A column 503 to Example B column 504 in this example. However, because the capacitive value of the smaller valued capacitors is typically based on the expected high frequency noise on the voltage lines, these capacitive values may be left as the vendor recommended values and not reduced, but the number of these capacitors may be reduced. In some circumstances even these recommended capacitive values may be reduced.

A data sheet for an active electronic circuit, component or device to be used in a SiP design will typically have wording that notes, to improve module performance, decoupling capacitors are required to suppress the switching noise generated by high frequency and to stabilize the supply voltage. And often the data sheet adds that a decoupling capacitor is most effective when it is close to the device, because this minimizes the inductance of the circuit board wiring and interconnects.

According to some embodiments, aspects relating to reductions in capacitors in a SiP design may also take advantage of the electrical parasitics of a SiP substrate design, and use them to reduce the need for high frequency capacitors in the SiP design, either in numbers or in capacitive value reductions to deal with higher frequencies.

According to some embodiments, a factor in designing a decoupling system for high frequencies is not the amount of capacitance, but rather the amount of inductance in the capacitor leads and the vias that attach the capacitors to the power and ground planes. The amount of inductance in series with the decoupling capacitors from the leads is a function of the trace length. Typical inductance of a FR-4 microstrip trace exposed to air on one side may be about 8 nH/inch. Keeping the traces short in the SiP compared to a PCB makes the inductance lower and the capacitance more effective. The amount of inductance in series with the decoupling capacitors from the vias is a function of the length of the via. Further, use of bare die in a SiP design according to embodiments reduces leads from the pin or ball of a packaged device to the die inside the package, which may serve to increase the frequency of the high frequency noise of concern.

Typical substrate dielectric thickness is 35 um compared to a typical PCB dielectric thickness in 110 um, resulting in three times less inductance for equal-diameter vias. Again, this helps to keep the inductance lower and make the capacitance more effective. According to certain aspects, the use of more parallel vias in a SiP design helps to minimize the inductance.

In certain aspects, optimal high frequency performance may be achieved by having lots of distributed capacitance at short distances from where it is needed, so that there is minimum series inductance. Since a SiP typically will have dielectrics which are three times, or more, thinner than PCBs, creating adjacent power and ground planes as much as possible creates the distributed capacitance. Again, this reduces the need for high-frequency decoupling capacitors in number and even capacitive values.

Figure 6:
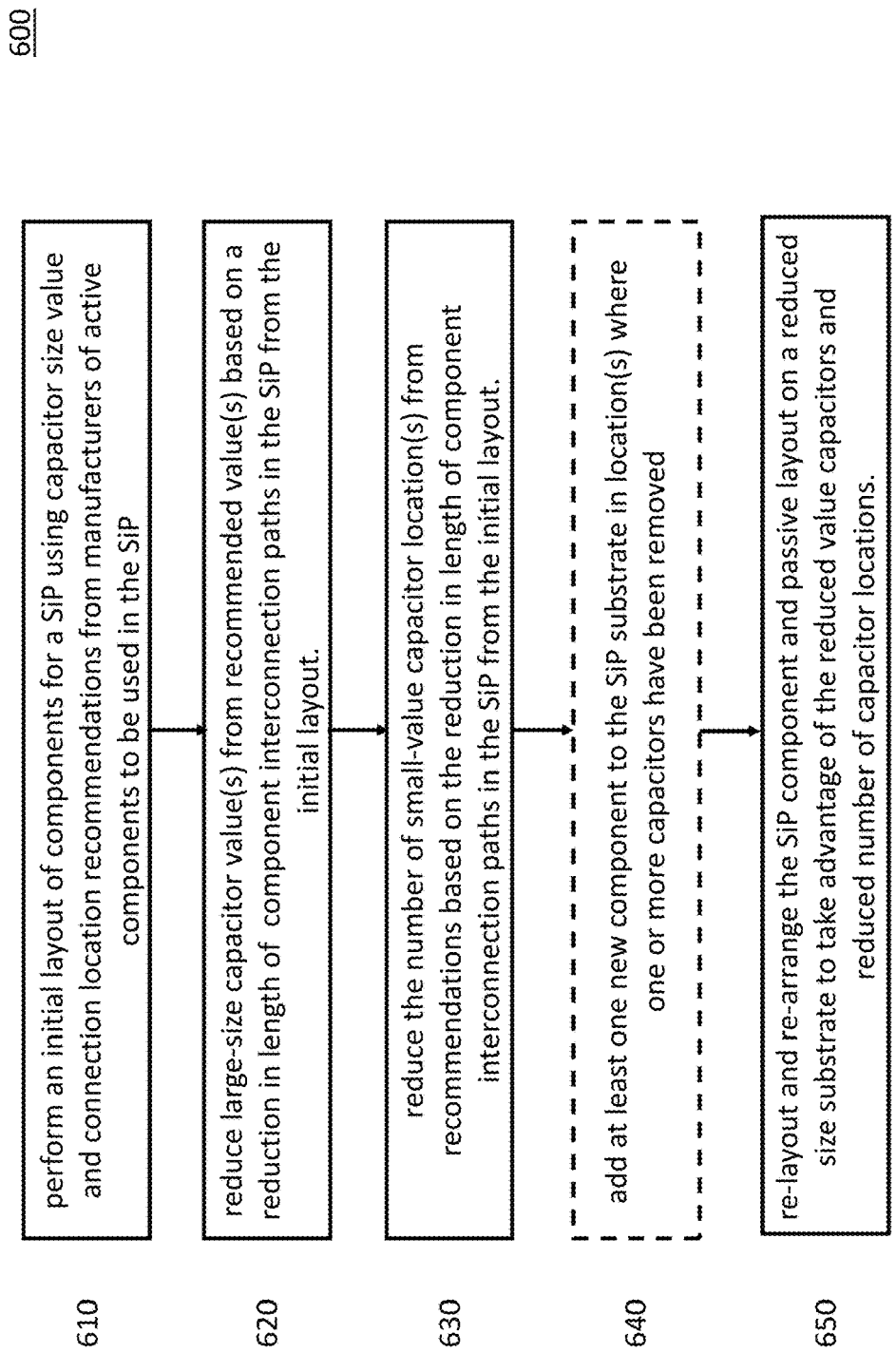
FIG. 6 is a flow chart depicting a process according to some embodiments.

Referring now to FIG. 6, a process 600 for layout optimization is provided according to some embodiments. For instance, process 600 may be used to reduce the number of passive components and/or the size of such components in a device design, such as in a System-in-Package design. Process 600 may begin with step 610, performing an initial layout of components for a SiP using capacitor size value and connection location recommendations from manufacturers of active components to be used in the SiP. In step 620, large-size capacitor value(s) are reduced from recommended value(s) based on a reduction in length of component interconnection paths in the SiP from the initial layout. In step 630, the number of small-value capacitor location(s) is reduced from recommendations based on the reduction in length of component interconnection paths in the SiP from the initial layout. In step 640, which may be optional in certain embodiments, at least one new component is added to the SiP substrate in location(s) where one or more capacitors have been removed. In step 650, the SiP component and passive layouts are updated on a reduced size substrate to take advantage of the reduced value capacitors and reduced number of capacitor locations.

In FIG. 6, process 600 is described with respect to a reduction in large-sized capacitor values and a reduction in the number of small-value capacitor locations. However, in some embodiments, the values of a first type of capacitor (e.g., large-sized capacitors) may be reduced without a corresponding reduction of a second type. Similarly, a second type of capacitor (e.g., small-sized capacitors) may be value-reduced without a corresponding reduction of a first type. In some embodiments, both the value and number of both types are reduced. In some embodiments, only the number of one or both types of capacitor is reduced. This is also true for process 800, as described with respect to FIG. 8. Aspects of the present disclosure may enable alternative mechanisms for optimizing a SiP layout by reducing the value and/or number of one or more types of capacitors to be different from recommended vendor values.

Referring now to FIG. 7, an example summary table 700 of vendor requirements for decoupling capacitors found in a microprocessor data sheet is provided. Table 700 has three columns: the first column 701 lists the various voltages rails used by the microprocessor; the second column 702 lists the quantity of large (CL) capacitors required to stabilize the supply voltages at the pins of the processor; and the third column 703 lists the quantity of small (CS) capacitors required to suppress the high-frequency switching noise on the voltage rails.

In this example, the first voltage requirement is VDD_CORE 704. To apply the data sheet requirements there needs to be one large capacitor 705 and eight small capacitors 706. The specific values of the large and small capacitors are given in the data sheet and are 10 uF and 10 nF, respectively. Similarly, the VDDS_DDR 714 requirement is three large capacitors 715 and 18 small capacitors 716. Although not described in FIG. 7, a data sheet typically provides details as to where these capacitors need to be placed on a system PCB.

Figure 8:
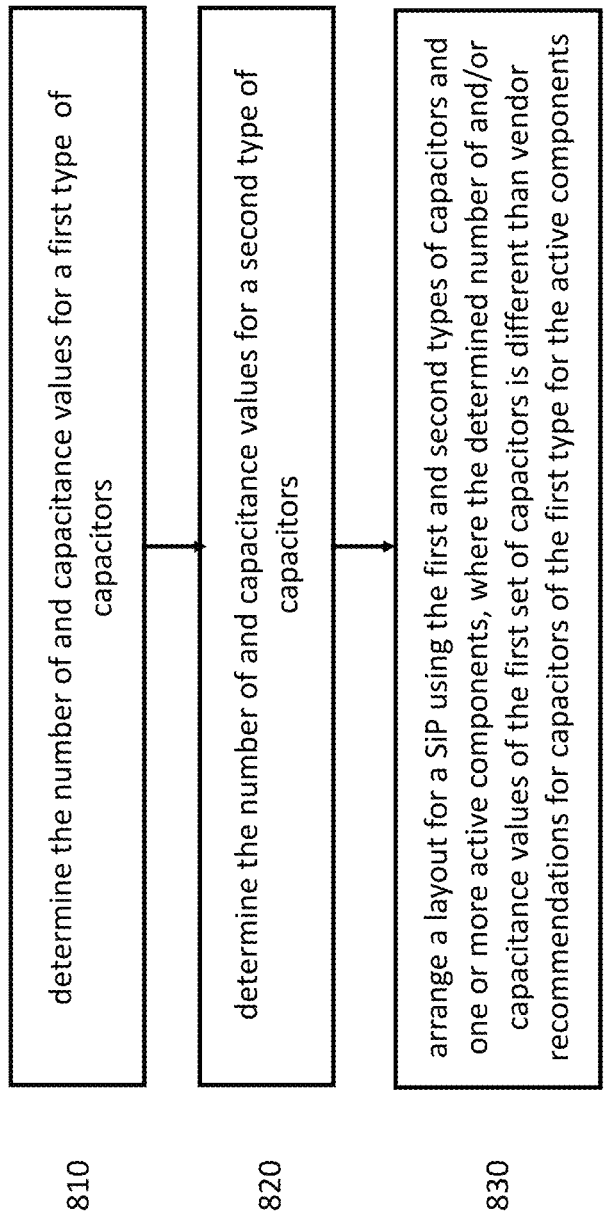
FIG. 8 is a flow chart depicting a process according to some embodiments.

Referring now to FIG. 8, a process 800 for designing a System-in-Package (SiP) according to some embodiments is provided. The process may begin with step 810, in which the number of and capacitance values for a first type of capacitor is determined. For instance, the number of capacitors used, and the capacitance values used for a first set of capacitors is determined, where each capacitor in the set has a first type. In step 820, the number of and capacitance values for a second type of capacitor is determined. For instance, the number of capacitors used, and the capacitance values used for a second set of capacitors is determined, where each capacitor in the set has a second type. According to embodiments, the first and second type of capacitors are different. For example, the first type of capacitors may be large-valued core voltage decoupling capacitors while the second type of capacitors are small-valued noise decoupling capacitors. In step 830, a layout for a SiP using the first and second types of capacitors and one or more active components is arranged. According to some embodiments, the determined number of and/or values of capacitors of the first or second type is different from the recommendation of the vendor. For instance, the determined number of the first set of capacitors may be less than vendor recommended numbers of capacitors of the first type for the one or more active components.

According to some embodiments, the determined number of the second type of capacitors is less than a vendor recommended number of capacitors of the second type for the one or more active components. Additionally, the capacitance values for the first type of capacitors may be less than vendor recommended capacitance values of the first type for the one or more active components. In some embodiments, the capacitance values for the second type of capacitors may be less than vendor recommended capacitance values of the second type for the one or more active components. Moreover, and in some embodiments, at least one of determining the number of and capacitance values for a first type of capacitor and determining the number of and/or capacitance values for a second type of capacitors is based at least in part on a reduction in component interconnection path lengths in the SiP.

While the foregoing embodiments are described with respect to changes in the number of and/or value of capacitors from recommended vendor specifications, they may also be applied to differences in other passive components, such as resistors and inductors. For instance, embodiments may include designing a System-in-Package (SiP) with the number of and/or value of resistors and/or inductors connected to an electronic component that differ from vendor recommendations based on a reduction in distance, as described above with respect to capacitors. Additionally, embodiments may include a difference in the number of and/or value of capacitors in combination with differences from vender recommendations as to other passive components.

While various embodiments of the present disclosure are described herein, it should be understood that they have been presented by way of example only, and not limitation. Thus, the breadth and scope of the present disclosure should not be limited by any of the above-described exemplary embodiments. Moreover, any combination of the above-described elements in all possible variations thereof is encompassed by the disclosure unless otherwise indicated herein or otherwise clearly contradicted by context.

Additionally, while the processes described above and illustrated in the drawings are shown as a sequence of steps, this was done solely for the sake of illustration. Accordingly, it is contemplated that some steps may be added, some steps may be omitted, the order of the steps may be re-arranged, and some steps may be performed in parallel. Although the present disclosure and its advantages have been described in detail, it should be understood that various changes, substitutions and alterations can be made herein without departing from the spirit and scope of the disclosure as defined by the appended claims.

What is claimed is:

1. A method for designing a System-in-Package (SiP), comprising:
    selecting a plurality of active components for use in an SiP design;
    determining the number of and capacitance values for a first type of capacitors from an associated data sheet for each of said plurality of active components, wherein said data sheet includes information identifying the recommended number of capacitors and capacitive values to be used with each active component of said plurality of active components for normal operating conditions;
    determining the number of and capacitance values for a second type of capacitors from said associated data sheet; and
    arranging and operatively interconnecting said plurality of active components for said SiP design on a SiP substrate and operatively interconnecting said first and second types of capacitors on said SiP substrate to said plurality of active components, wherein the arranged number of said first type of capacitors included in said SiP design is less than the number of capacitors of said first type determined from said associated data sheet for each active component of said plurality of active components.

2. The method of claim 1, wherein the arranged number of said second type of capacitors is less than the number of capacitors of said second type determined from said associated data sheet for each active component of said plurality of active components.

3. The method of claim 1, wherein said first type of capacitors are large-valued voltage decoupling capacitors and the second type of capacitors are small-valued noise decoupling capacitors.

4. The method of claim 2,
wherein the capacitance values for said first type of capacitors is less than the capacitance values of said first type determined from said associated data sheet for each active component of said plurality of active components, and
wherein the capacitance values for said second type of capacitors are different from the capacitance values of said second type determined from said associated data sheet for each active component of said plurality of active components.

5. The method of claim 1, wherein at least one of said determining the number of and capacitance values for a first type of capacitors and said determining the number of and capacitance values for a second type of capacitors is based at least in part on a reduction in component interconnection path lengths in said SiP design.

6. The method of claim 1, wherein arranging said plurality of active components for said SiP using said first and second types of capacitors comprises:
adding an additional active component without increasing the size of said SiP substrate.

7. A System-in-Package (SiP), comprising:
a SiP substrate;
a plurality of electronic circuits operatively mounted on said SiP substrate for a preselected design, wherein each of said plurality of electronic circuits has an associated data sheet listing a recommended quantity and value for a first type of passives for correct operation of each of said plurality of electronic circuits, wherein each of said associated data sheets is supplied by each vendor manufacturing each one of said electronic circuits of said plurality of electronic circuits; and
a first plurality of passives of said first type connected to at least one of said electronic circuits of said plurality of electronic circuits,
wherein the number of said first plurality of said first type of passives is less than said recommended quantity in each of said associated data sheets.

8. The SiP of claim 7, further comprising:
a second plurality of passives of a second type connected to at least one of said electronic circuits of said plurality of electronic circuits,
wherein said at least one of said electronic circuits of said plurality of electronic circuits has a second recommended quantity for said second type of passive in said associated data sheet for correct operation of at least one of said electronic circuits of said plurality of electronic circuits, and
wherein said second plurality of said second type of passives is less than said recommended quantity in each of said associated data sheets.

9. The SiP of claim 8, wherein said first type of passives comprise capacitors that are large-valued voltage decoupling capacitors and the second type of passives comprise capacitors that are small-valued noise decoupling capacitors.

10. The SiP of claim 9,
wherein said first plurality of said first type of capacitors is connected to a power rail from an electronic circuit supplying power and located adjacent said at least one of said electronic circuits of said plurality of electronic circuits, and
wherein said second plurality of said second type of capacitors is connected to said power rail and located adjacent said at least one of said electronic circuits of said plurality of electronic circuits.

11. The SiP of claim 10, wherein the reduced quantity of said first and second pluralities of capacitors is functionally related to the relative distance between said electronic circuit supplying power and said at least one of said electronic circuits of said plurality of electronic circuits.

12. The SiP of claim 11, wherein said electronic circuit supplying power is a Power Management Integrated Circuit (PMIC) adapted to control power supplied to said at least one of said electronic circuits of said plurality of electronic circuits.

13. The SiP of claim 12, wherein a distance between said electronic circuit supplying power and said at least one of said electronic circuits of said plurality of electronic circuits is less than or equal to 1.0 cm and said SiP substrate has a surface area of less than or equal to 441 $mm^2$.

14. A System-in-Package (SiP), comprising:
a substrate;
at least one electronic circuit operatively mounted on said substrate for a preselected SiP design, wherein said at least one electronic circuit has an associated data sheet containing recommended capacitive values for a first type of capacitor for correct operation of said at least one electronic circuit; and
a first plurality of capacitors of said first type mounted on said substrate and operatively connected to said at least one electronic circuit,
wherein the capacitive value of at least one of said first plurality of said first type of capacitors is less than said recommended capacitive value in said associated data sheet.

15. The SiP of claim 14, further comprising:
a second plurality of capacitors of a second type of capacitor mounted on said substrate and operatively connected to said at least one electronic circuit,
wherein said at least one electronic circuit has a recommended value for said second type of capacitor for correct operation of said at least one electronic circuit provided in said associated data sheet, and
wherein a capacitive value of at least one of said second plurality of said second type of capacitors is less than said recommended capacitive value in said associated data sheet.

16. The SiP of claim 15, wherein said first type of capacitors are large-valued voltage decoupling capacitors and the second type of capacitors are small-valued noise decoupling capacitors.

17. The SiP of claim 16,
wherein said first plurality of said first type of capacitors is connected to a power rail from an electronic circuit supplying power and located adjacent said at least one electronic circuit, and
wherein said second plurality of said second type of capacitors is connected to said power rail and located adjacent said at least one electronic circuit.

18. The SiP of claim 17, wherein the reduced capacitive values of said first and second pluralities of capacitors is functionally related to the relative distance between said electronic circuit supplying power and said at least one electronic circuit.

19. The SiP of claim 18, wherein said electronic circuit supplying power is a Power Management Integrated Circuit (PMIC) adapted to control power supplied to said at least one electronic circuit.

20. The SiP of claim 17, wherein a distance between said electronic circuit supplying power and said at least one electronic circuit is less than or equal to 1.0 cm and said SiP substrate has a surface area of less than or equal to 441 $mm^2$.

* * * * *